US011735954B2

(12) United States Patent
Toulgoat-Dubois et al.

(10) Patent No.: US 11,735,954 B2
(45) Date of Patent: *Aug. 22, 2023

(54) AUTONOMOUS TOPOLOGY VALIDATION FOR ELECTRICAL SUPPLY NETWORK

(71) Applicant: Landis+Gyr Innovations, Inc., Alpharetta, GA (US)

(72) Inventors: Frederic Charles Toulgoat-Dubois, Raleigh, NC (US); Carson Zerpa, Vero Beach, FL (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,516

(22) Filed: Oct. 25, 2022

(65) Prior Publication Data

US 2023/0046299 A1 Feb. 16, 2023

Related U.S. Application Data

(63) Continuation of application No. 17/026,648, filed on Sep. 21, 2020, now Pat. No. 11,515,725.

(51) Int. Cl.
*H02J 13/00* (2006.01)
*G01D 4/00* (2006.01)
(Continued)

(52) U.S. Cl.
CPC ........ *H02J 13/00006* (2020.01); *G01D 4/004* (2013.01); *G01R 22/00* (2013.01);
(Continued)

(58) Field of Classification Search
CPC .... H02J 13/00006; H02J 3/00; H02J 2203/20; H02J 2203/10; H02J 13/00002;
(Continued)

(56) References Cited

U.S. PATENT DOCUMENTS 6,615,147 B1  9/2003  Jonker et al.
6,816,360 B2  11/2004  Brooksby et al.
(Continued)

FOREIGN PATENT DOCUMENTS

WO  2014152458  9/2014
WO  2018027180  2/2018
(Continued)

OTHER PUBLICATIONS

Live Line Phase Identification—Phase ID 6000, Power Systems Integrity Inc., Accessed from Internet on Feb. 25, 2020, 2 pages.
(Continued)

*Primary Examiner* — Ziaul Karim
(74) *Attorney, Agent, or Firm* — Kilpatrick Townsend & Stockton LLP

(57) ABSTRACT

A system for autonomously validating the topology information of an electrical power distribution system is provided. For example, the system includes a group of meters previously determined to be connected to the same transformer of an electrical power distribution system. The group of meters is configured to perform family check periodically or upon request and to identify orphan meters in the group. The identified orphan meter can contact a community device communicatively connected to meters in more than one group to request a community check. The community device performs the community check by contacting meters in other groups of meters and obtain their family signature data. The community device further determines whether the orphan meter belongs to a new family based on the voltage data of the orphan meter and the family signature data of other groups. The orphan meter can report the community check results to a headend system.

20 Claims, 10 Drawing Sheets

(51) Int. Cl.
*G01R 22/00* (2006.01)
*H02J 3/00* (2006.01)

(52) U.S. Cl.
CPC ............ *H02J 3/00* (2013.01); *H02J 2203/20* (2020.01); *H04Q 2209/823* (2013.01)

(58) Field of Classification Search
CPC .. G01D 4/004; G01R 22/00; H04Q 2209/823; Y04S 10/30; Y04S 40/12; Y04S 20/30; Y04S 40/20; Y02E 60/00
See application file for complete search history.

(56) References Cited

U.S. PATENT DOCUMENTS

| | | | |
|---|---|---|---|
| 7,135,850 | B2 | 11/2006 | Ramirez |
| 7,469,190 | B2 | 12/2008 | Bickel |
| 7,693,670 | B2 | 4/2010 | Durling et al. |
| 7,990,806 | B2 | 8/2011 | Chen |
| 8,004,933 | B2 | 8/2011 | Iseli |
| 8,121,741 | B2 | 2/2012 | Taft et al. |
| 8,223,466 | B2 | 7/2012 | Roscoe |
| 8,322,215 | B2 | 12/2012 | Lakich et al. |
| 8,326,554 | B2 | 12/2012 | Caird |
| 8,635,036 | B2 | 1/2014 | Pamulaparthy et al. |
| 8,754,634 | B2 | 6/2014 | Chamarti et al. |
| 8,830,083 | B2 | 9/2014 | LaFrance et al. |
| 8,854,217 | B2 | 10/2014 | Brown et al. |
| 8,947,246 | B2 | 2/2015 | Aiken |
| 8,978,443 | B2 | 3/2015 | Ramirez |
| 8,996,144 | B2 | 3/2015 | LaFrance et al. |
| 9,164,135 | B2 | 10/2015 | Cs et al. |
| 9,304,014 | B2 | 4/2016 | Komati et al. |
| 9,341,686 | B2 | 5/2016 | Deak et al. |
| 9,476,740 | B2 | 10/2016 | Zigovszki et al. |
| 9,557,392 | B2 | 1/2017 | Schuhl et al. |
| 9,568,522 | B2 | 2/2017 | Aiello et al. |
| 9,602,895 | B2 | 3/2017 | Bowling et al. |
| 9,671,254 | B2 | 6/2017 | Zigovszki et al. |
| 9,887,051 | B2 | 2/2018 | LaFrance et al. |
| 9,891,088 | B2 | 2/2018 | Zigovszki et al. |
| 10,240,961 | B2 | 3/2019 | Cheng et al. |
| 10,254,315 | B2 | 4/2019 | Higashi et al. |
| 10,295,578 | B2 | 5/2019 | Higashi et al. |
| 2005/0273281 | A1* | 12/2005 | Wall .................. G06Q 50/06 702/60 |
| 2012/0182157 | A1 | 7/2012 | Carr |
| 2014/0005853 | A1 | 1/2014 | Chen et al. |
| 2014/0067151 | A1* | 3/2014 | Erhart ............... H02J 13/00034 700/297 |
| 2014/0070617 | A1* | 3/2014 | Detmers ................ H02J 7/04 307/64 |
| 2014/0070756 | A1 | 3/2014 | Kearns et al. |
| 2014/0088781 | A1 | 3/2014 | Kearns et al. |
| 2015/0052088 | A1 | 2/2015 | Arya et al. |
| 2015/0241482 | A1 | 8/2015 | Sonderegger |
| 2017/0008162 | A1* | 1/2017 | Tsubota ............... H04L 12/282 |
| 2018/0073910 | A1 | 3/2018 | Deak et al. |
| 2018/0106640 | A1 | 4/2018 | Padrones et al. |
| 2019/0041436 | A1 | 2/2019 | Kuloor et al. |
| 2019/0041439 | A1 | 2/2019 | Brown |
| 2019/0041445 | A1* | 2/2019 | Kuloor ............. H02J 13/00006 |
| 2019/0094329 | A1 | 3/2019 | Minich |
| 2019/0101411 | A1 | 4/2019 | Davis et al. |
| 2019/0129368 | A1 | 5/2019 | Iacovella et al. |
| 2019/0219618 | A1 | 7/2019 | Davis et al. |
| 2019/0383864 | A1 | 12/2019 | Joshi et al. |

FOREIGN PATENT DOCUMENTS

| | | |
|---|---|---|
| WO | 2018072030 | 4/2018 |
| WO | 2018083902 | 5/2018 |
| WO | 2019026791 | 2/2019 |

OTHER PUBLICATIONS

U.S. Appl. No. 17/026,648, Non-Final Office Action dated Apr. 14, 2022, 14 pages.
U.S. Appl. No. 17/026,648, Notice of Allowance dated Aug. 1, 2022, 22 pages.
Arya et al., Phase Identification in Smart Grids, IEEE International Conference on Smart Grid Communications (SmartGridComm), Oct. 17-20, 2011, pp. 25-30.
Byun et al., Cable and Phase Identification Based on Power Line Communication, International Journal of Control and Automation, vol. 8, No. 9, 2015, pp. 63-74.
International Application No. PCT/US2021/050422, International Search Report and Written Opinion dated Dec. 3, 2021, 13 pages.
Short, Advanced Metering for Phase Identification, Transformer Identification, and Secondary Modeling, IEEE Transactions on Smart Grid, vol. 4, No. 2, Jun. 2013, pp. 651-658.

* cited by examiner

CORRELATION DATA 312

| METER | A | B | C | D |
|---|---|---|---|---|
| B | 0.95 | | | |
| C | 0.63 | 0.7 | | |
| D | 0.9 | 0.89 | 0.71 | |
| E | 0.92 | 0.93 | 0.66 | 0.96 |

AUTONOMOUS TOPOLOGY VALIDATION FOR ELECTRICAL SUPPLY NETWORK

RELATED APPLICATIONS

This application is a continuation of U.S. patent application Ser. No. 17/026,648, titled "Autonomous Topology Validation for Electrical Supply Network" and filed on Sep. 21, 2020, which is incorporated herein in its entirety.

TECHNICAL FIELD

This disclosure generally relates to electrical supply networks and more particularly relates to the validation of the topology information of the electrical supply networks via edge intelligence.

BACKGROUND

Utility companies typically manually track the locations of electric meters installed in the field as well as the connectivity of the electric meters to distribution transformers. For large utility companies, the number of electric meters can be upwards of a few million with distribution transformers being close to one million, rendering this manual process time consuming and error-prone. In addition, the connectivity of the electric meters to distribution transformers may change from time to time due to ongoing residential and commercial construction, demolition or renovation, utility equipment upgrades, repairs, or maintenance, disaster response, falling trees, storms, and so on. This poses more challenges to the manual tracking of the topology information of the electric meters.

SUMMARY

Aspects and examples are disclosed for apparatuses and processes for autonomous topology validation for an electrical power distribution system. In one example, a system for validating relationships between meters in an electrical power distribution system includes a plurality of meters connected to the electrical power distribution system and communicatively connected through a communication network. The plurality of meters comprise a first group of meters and a second group of meters. The first group of meters were previously determined to be connected to a first transformer of the electrical power distribution system and are configured for performing a family check to determine an orphan meter in the first group of meters that is connected to a transformer different from the first transformer. The orphan meter, when operating in an orphan mode, is configured for sending a community check request through the communication network to identify a new group for the orphan meter. The system further includes a community device communicatively connected to the orphan meter in the first group of meters and a meter in the second group of meters through the communication network. The community device is configured for receiving, from the orphan meter, the community check request through the communication network and sending a family check request to the meter in the second group of meters. The family check request requests the second group of meters to perform a family check and generate family signature data of the second group of meters. The community device is further configured for receiving, from the meter in the second group of meters, the family signature data of the second group of meters through the communication network, and generating community check results indicating whether the new group is found for the orphan meter based, at least in part, upon voltage data of the orphan meter and the family signature data of the second group of meters. The community device further sends the community check results to the orphan meter. The orphan meter is further configured to send validation report data to a headend system over the communication network based on the community check results.

In another example, a method is performed by a community device for discovering relationships between an orphan meter and a group of meters connected to an electrical power distribution network. The method includes receiving, from the orphan meter, a community check request through a communication network communicatively connecting, the orphan meter, the group of meters and the community device. The method further includes, responsive to receiving the community check request, sending, through the communication network, a family check request to a meter that is in the group of meters and directly communicated with the community device during a past time period. The family check request requests the group of meters to perform a family check and generate a family signature data of the group. The method further includes receiving, from the meter in the group of meters, the family signature data of the group through the communication network, determining the relationships between the orphan meter and the group of meters based, at least in part, upon voltage data of the orphan meter and the family signature data of the group, and sending the determined relationships to the orphan meter.

In yet another example, a system includes a group of meters previously determined to be connected to a same transformer of an electrical power distribution system and communicatively connected through a communication network. The group of meters comprises one or more meters configured for determining, by one meter in the group of meters, to perform a family check for the group of meters, and responsive to determining to perform the family check for the group of meters, sending, by the one meter, a family check message to each of other meters in the group. The family check message comprises a request for voltage data and a timestamp. The one or more meters are further configured to receiving, by the one meter from the other meters in the group, the voltage data for a time period determined according to the timestamp, performing, by at least the one meter, correlations between voltage change data determined using the voltage data of the group of meters, calculating an average voltage data for each meter in the group; and identifying an orphan meter from the group of meters based on the average voltage data of the orphan meter falling below a threshold value of correlation.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
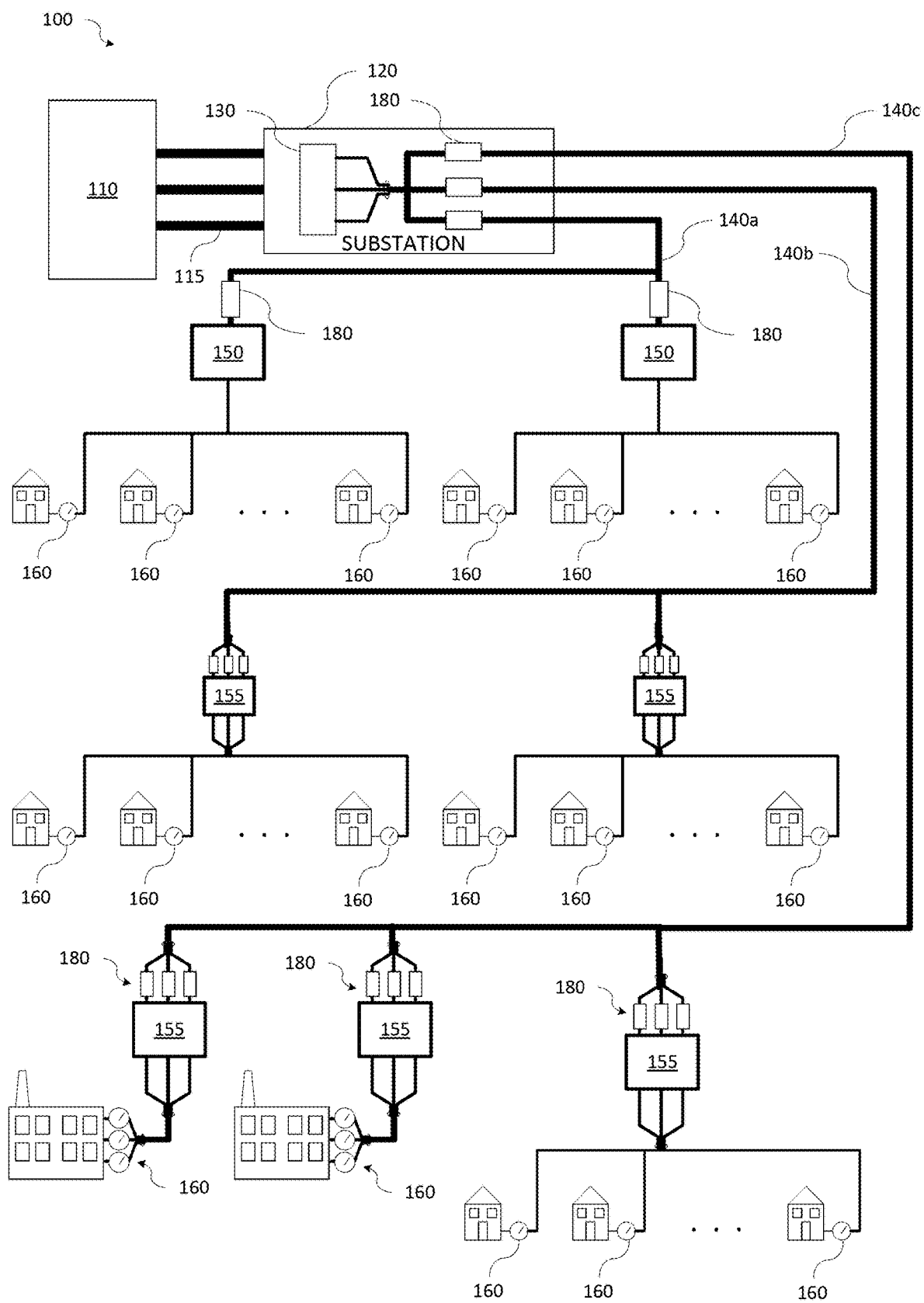
FIG. 1 is a block diagram illustrating an electrical power distribution system according to certain aspects of the present disclosure.

Systems and methods are provided for autonomously validating the topology information of assets in an electrical power distribution system. The topological information of assets can include the electrical connectivity relationship indicating the connections of the assets to power distribution elements such as transformers. For example, assets in the electrical power distribution system (e.g., meters) that are equipped with sensors can be configured to measure characteristic parameters of the power distribution network (e.g., voltage, current, load impedance). Assets connected to the same power distribution component (e.g., a transformer) can observe a similar fluctuation in the sensed data, whereas assets connected to different components generally do not observe the same fluctuation. As such, the assets can be configured to generate samples of the sensed data (e.g., the voltage data) and share the data samples with neighboring assets that are connected to the same power distribution component to validate their relationship. Assets that are determined to be connected to the same power distribution component are referred to as a family of assets, such as a family of meters connected to the same transformer, and the assets in the family are also referred to as sibling assets.

In examples, a first asset in a family can decide to initiate a family check based on the samples of the sensed data to validate the relationship among the assets in the family. The first asset can send a family check message to each of the assets in the family to request each asset to enter a family check mode. Upon receiving the family check message, each asset can save samples of sensed data for a timeframe determined by a timestamp specified in the family check message and send the saved samples of sensed data to the first asset that initiated the family check. The first asset can perform correlations using the received samples of data and generate a correlation matrix.

Depending on the available computing resources at the first asset, the first asset can perform all the correlations for the family of assets or perform a portion of the correlations, such as the correlations between the first asset itself and each of other assets in the family. The first asset can send the partially generated correlation matrix and the samples of the assets in the family to a second asset in the family to have the remaining correlations performed. Similarly, the second asset can finish the rest of correlations or perform a portion and send data to a next asset in the family to finish the correlation. The last asset that completes the correlations can perform the validation based on the completed correlation matrix. For example, the last asset can compare the correlation of each asset with a threshold value for family check to determine whether the asset still belongs to the family.

If the correlation of an asset falls below the threshold value, the last asset can identify the asset as an orphan asset, otherwise the asset remains to be a sibling asset in the family. The last asset can send the orphan asset an orphan notice informing its orphan status. The orphan asset, upon receiving the orphan notice, can contact a community device who is in direct communication with another family of assets to request a community check. Other assets in the family can return to a normal operational state.

During the community check, the community device can request the other family of assets to perform a family check and return a family signature data. The family signature data can be, for example, the average of the samples of sensed data in the second family. The community device can determine whether the orphan asset belongs to the second family by calculating a correlation between the samples of the orphan asset and the family signature data and comparing the correlation with a threshold value for community check. The community device may repeat this process for different families of assets and notify the orphan asset whether a new family is found. Based on the community check results, the orphan asset can send a validation report to a headend system to report its new family or to seek a new family assignment if no new family is found during the community check.

Techniques described in the present disclosure increase the efficiency and accuracy of the topology validation for assets in an electrical power distribution system and the communication between the assets and the headend system. By configuring the assets to generate and share data samples with neighboring assets through local network connections instead of sending the data samples to the headend system, the communication bandwidth usage in the network is optimized by local transactions, and the communication bandwidth requirement to the headend system is significantly reduced. In addition, by distributing the computation among assets allows the assets that have spare computing capacity and are otherwise idle most of the time to be utilized. In this way, the processing can be decentralized without sending all the data to a single place (such as the headend system) for massive processing operations which also reduces the distance that the data needs to be moved.

In addition, by allowing the analysis of the data samples to be distributed to various assets in the family, the computational requirements of each individual asset can be reduced. Compared with the traditional topology validation approaches, the validation process proposed herein can be carried out automatically and periodically without human intervention.

Consequently, a more accurate and up to date detection of topology information of the power distribution system can be achieved.

Exemplary Operating Environment

FIG. 1 is a block diagram illustrating an electrical power distribution system 100 according to various aspects of the present disclosure. In FIG. 1, an electrical power generation facility 110 may generate electrical power. The generated electrical power may be, for example, 3-phase alternating current (AC) power. In a three-phase power supply system, three conductors each carry an alternating current of the same frequency and voltage amplitude relative to a common reference, but with a phase difference of one-third of a cycle between each. The electrical power may be transmitted at high voltage (e.g., around 140-750 kV) via transmission lines 115 to an electrical power substation 120.

At the electrical power substation 120 a step-down transformer 130 may step down the high voltage power to a voltage level more suitable for customer usage, referred to as a distribution or "medium" voltage, typically around 13 kV. The stepped down 3-phase power may be transmitted via feeders 140a, 140b, 140c to distribution transformers 150, 155 which may further step down the voltage (e.g., 120-240V for residential customers). Each distribution transformer 150, 155 may deliver single-phase and/or 3-phase power to residential and/or commercial customers. From the distribution transformers 150, 155, electrical power is delivered to the customers through electric meters 160. The electric meters 160 may be supplied by the power utility company and may be connected between the loads (i.e., the customer premises) and the distribution transformers 150, 155. Three-phase transformers 155 may deliver 3-phase power to customer premises, for example, by powering three lines on the street front.

Sensors 180 may be distributed throughout the network at various assets, for example, but not limited to, feeder circuits, distribution transformers, etc. The sensors 180 may sense various circuit parameters, for example, frequency, voltage, current magnitude, and phase angle, to monitor the operation of the electrical power distribution system 100. It should be appreciated that the illustrated locations of the sensors in FIG. 1 are merely exemplary and that sensors may be disposed at other locations and that additional or fewer sensors may also be used.

As can be seen from FIG. 1, each asset is connected to one or more segments of the electrical power distribution system 100 (e.g., a meter is connected to a distribution transformer). The disclosure presented herein can automatically validate the segment of the assets in the electrical power distribution system 100 and update such information as the electrical connectivity (i.e. how the components are wired together electrically) of the electrical power distribution system 100 change over time. The following description utilizes meters as an example of the assets, uses validating the connection of meters to a distribution transformer as an example for the topology information validation, and uses voltage data as an example of the sensed data by the assets. It should be understood that the described techniques also apply to other types of assets configured with sensors, such as transformers, generators, contactors, re-closers, fuses, switches, street lighting, ripple receivers, ripple generators, capacitor banks, batteries, synchronous condensers, etc. The described techniques also apply to topology information validation at other levels, such as at the substation level and other types of sensed data, such as current or load impedance.

Figure 2:
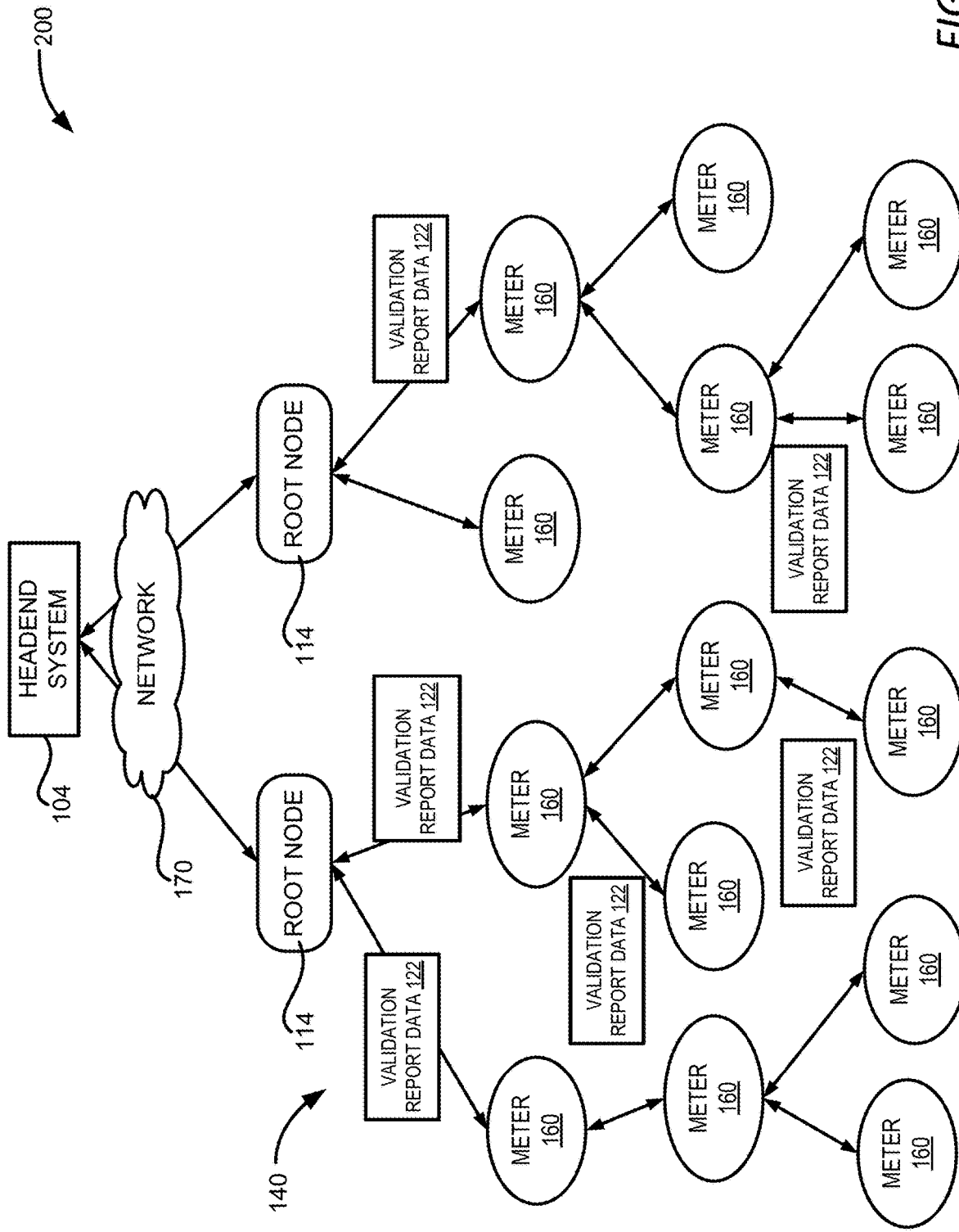
FIG. 2 is a block diagram showing an illustrative operating environment for autonomously validating topology information in an electrical power distribution system, according to certain aspects of the present disclosure.

FIG. 2 shows an illustrative operating environment 200 for validating topology information in an electrical power distribution system, such as the electrical power distribution system 100 shown in FIG. 1. The environment 200 includes a mesh network 140 associated with the electrical power distribution system for delivering measurement data obtained by meters in the electrical power distribution system. The mesh network 140 includes multiple electricity meters 160 deployed at various geographical locations of the customer premises through the electrical power distribution system 100. The meters 160 can be implemented to measure various operating characteristics of the electrical power distribution system 100, such as characteristics of resource consumption or other characteristics related to power usage in the system. Example characteristics include, but are not limited to, average or total power consumption, the peak voltage of the electrical signal, power surges, and load changes. In some examples, the meters 160 include commercial & industrial (C&I) meters, residential meters, and so on.

The meters 160 can transmit data including the collected or generated meter measurement data, and other data such as the validation report data 122, through the mesh network 140 to root nodes 114. The root nodes 114 of the mesh network 140 may be configured for communicating with the meters 160 to perform operations such as managing the meters 160, collecting measurement data and other data from the meters 112, and forwarding data to a headend system 104. A root node 114 can also be configured to function as a node to measure and process data itself. The root nodes 114 may be personal area network (PAN) coordinators, gateways, or any other devices capable of communicating with the headend system 104 and other meters 112.

The root nodes 114 ultimately transmit the generated or collected meter measurement data and other data such as the validation report data 122 to the headend system 104 via another network 170 such as the Internet, an intranet, or any other data communication network. The headend system 104 can function as a central processing system that receives streams of data or messages from the root nodes 114. The headend system 104, or another system associated with the utility company, can process or analyze the collected data for various purposes, such as billing, performance analysis or troubleshooting. In addition, if the headend system 104 receives the validation report data 122 from a meter 160, the headend system 104 or another system configured to maintain the topology information (e.g., a geographic information system or a customer information system (CIS)) can update the topology information based on the validation report data 122. As used herein, the term headend system 104 may be used to collectively refer to the headend system and other systems upstream from the headend system, such as the system configured to maintain the topology information. For example, if the validation report data 122 indicates that a meter 160 has been identified as an orphan meter and found another family of meters to join, the headend system 104 updates the information of the transformer that the meter is associated with in its system. If the validation report data 122 indicates that a meter 160 has been identified as an orphan meter but cannot find another family of meters to join through autonomous topology validation, the headend system 104 can determine the transformer that the meter 160 is connected to based on information available at the headend system 104 so that the meter 160 can join the corresponding family of meters.

It should be appreciated that while FIG. 2 depicts a specific network topology (e.g., a DODAG tree), other network topologies are also possible (e.g., a ring topology, a mesh topology, a star topology, etc.). In addition, although the following description will focus on the aspects of a group of meters 160, the technologies described herein can be applied by any meter in the mesh network, including the meters 160 and the root node 114.

It should be further understood that the mesh network 140 communicatively connecting the meters 160 are separate from and can overlay the network for distributing electrical power in the electrical power distribution system 100. As such, two meters 160 that are neighbors in the mesh network 140 may not be neighbors in the electrical power distribution network and vice versa. It is thus likely that two meters 160 that are connected to the same transformer may belong to different PANs and meters 160 belonging to the same PAN may be connected to different transformers.

Figure 3A:
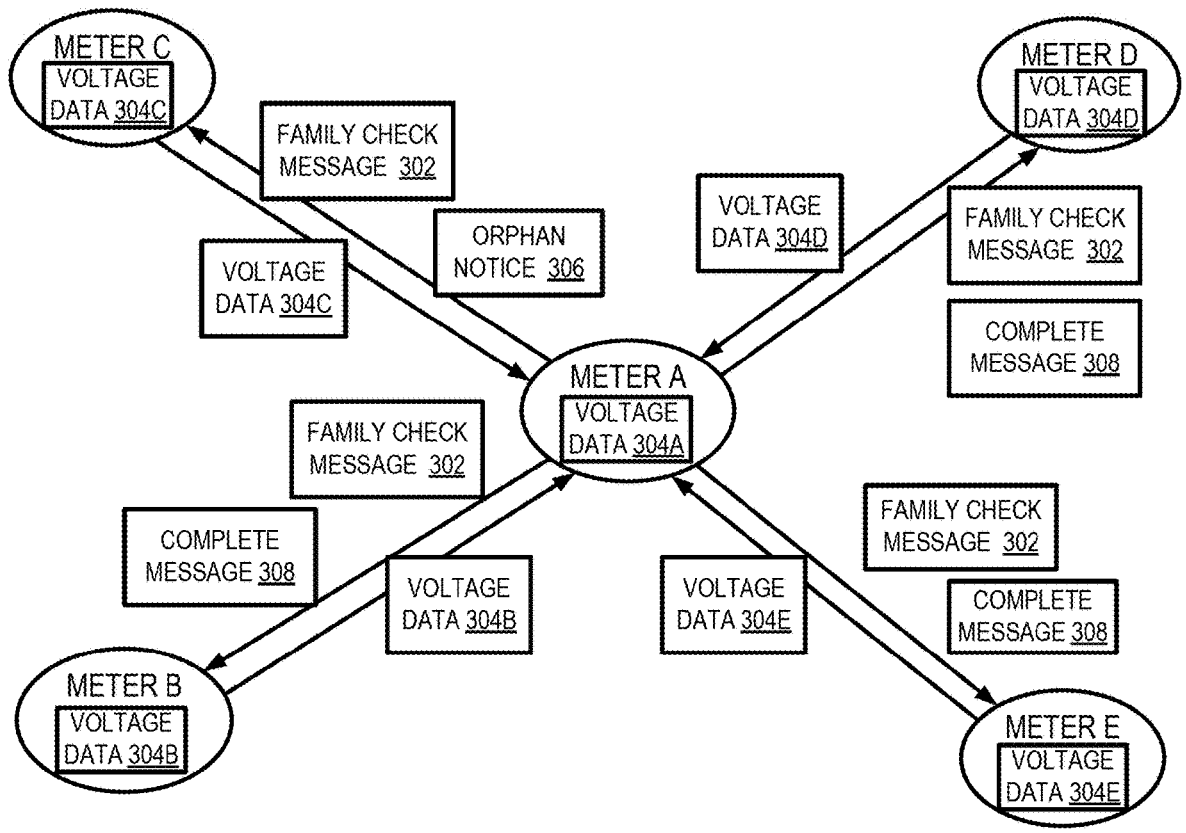
FIG. 3A shows an example of interactions among a family of meters during a family check and the correlation matrix generated through the family check, according to certain aspects of the present disclosure.

FIG. 3A shows an example of interactions among a family of meters A-E during a family check according to certain aspects of the present disclosure. FIG. 3A also shows an example of correlation data 312 generated during the family check. Meters A-E have been previously determined to be electrically connected to the same transformer and thus belong to the same family. Each of the meters in the family can be configured to maintain a list of other sibling meters that are in the family. The information of the list of sibling meters can be obtained, for example, from the headend system 104 and updated through autonomous topology validation disclosed herein.

The family of meters A-E may be configured to perform a family check periodically, such as every 24 hours. When the scheduled time is up, one of the meters, such as meter A shown in FIG. 3A, sends a family check message 302 to its sibling meters B-E to start the family check process. The meter that initiates the family check is also referred to herein as an initiating meter. It should be noted that any meter in the family may initiate the family check. Thus, it is likely that two or more meters may start the process at substantially the same time by sending the family messages to other sibling meters in the family. This could cause problems. For example, a sibling meter may receive two family check messages from two initiating meters and cannot decide which initiating meter it should respond to. Similarly, an initiating meter may receive a family check message from another initiating meter to request its response. If that happens, each of the sibling meters in the family can wait for a random time period and restart the family check process.

The family check process can also be started when one of the meters in the family receives a family check request from a community device as will be discussed below. If the family check is started due to a family check request, the clock for the scheduled family check will be reset so that the next family check is performed after the scheduled period of time has passed since the latest family check.

The family check message 302 can include a command for the sibling meters to enter a family check mode and a timestamp used for collecting voltage data at the respective sibling meters. Upon receiving the family check message 302, each of the sibling meters B-E enters a family check mode. In the family check mode, each of the meters in the family stores the voltage data for a time period. The time period of time can be determined based on the timestamp contained in the family check message 302. For example, each of the meters in the family is configured with a pre-determined parameter specifying the time duration of the voltage data to be collected for the family check, such as 30 minutes, one hour, or a few hours. The timestamp contained in the family check message 302 can specify the start of the time duration. As a result, each meter in the family can collect and store the voltage data 304 for the duration starting from the time point indicated by the timestamp. In some implementations, the timestamp indicates a time in the future. In other implementations, the timestamp can also indicate a time in the past if all the meters in the family have saved voltage data in the past, for example, for another task different from the family check.

After the meters collected their respective voltage data 304A-304E, meters B-E sends the voltage data to the initiating meter A. With the collected voltage data 304A-304E, meter A can perform correlations between the sibling meters in the family and generate correlation data such as a correlation matrix 312. In some examples, the correlation is performed between the voltage data of different meters. In other examples, the correlation is performed between the voltage change data of different meters instead of the voltage data itself. For example, meter A can determine the voltage change data for each meter based on the received voltage data from the corresponding meter. If the voltage data of a meter includes N samples, meter A can calculate N−1 voltage change data samples by taking the difference between every pair of adjacent voltage data samples. Generally speaking, calculating the correlation based on the voltage change data can lead to a more accurate result because voltage change correlation can normalize the spikes and sags against the nominal voltage of a meter. Meter A can further calculate an average correlation for each meter in the family. For example, the averaged correlation for meter A can be calculated by averaging the correlations between meter A and another meter in the family, such as the correlations between meters A and B, meters A and C, meters A and D, and meters A and E. The averaged correlations for other meters can be calculated similarly.

Based on the averaged correlations, meter A can validate the relationship among the family of meters. For example, if meter A determines that the averaged correlation of a sibling meter is below a threshold of correlation for family check $TH_{FC}$, meter A can determine that this sibling meter is an orphan meter not connected to the transformer and thus should be removed from the family of meters. For meters whose averaged correlations are above or equal to the threshold of correlation for family check $TH_{FC}$, meter A can determine that they are connected to the same transformer and still belong to the family of meters. Meter A can send a family check complete message 308 to each of the meters that are determined to be in the family, such as meters B, D, and E. Upon receiving the complete message 308, the respective meters can delete the saved voltage data and return to normal operational mode.

If meter A determines that a meter in the family has become an orphan meter, such as meter C, meter A can further send an orphan notice 306 to the orphan meter C. The orphan notice 306 can include data indicating the orphan status of the recipient meter. Alternatively, or additionally, the orphan notice 306 can include a command to request the recipient meter to perform a community check to find a new family. Upon receiving the orphan notice 306, meter C enters an orphan state and starts the community check process. Details of the community check are provided below with respect to FIGS. 4 and 8. Meter A can further delete its stored voltage data 304A and returns to the normal operational state.

Figure 3B:
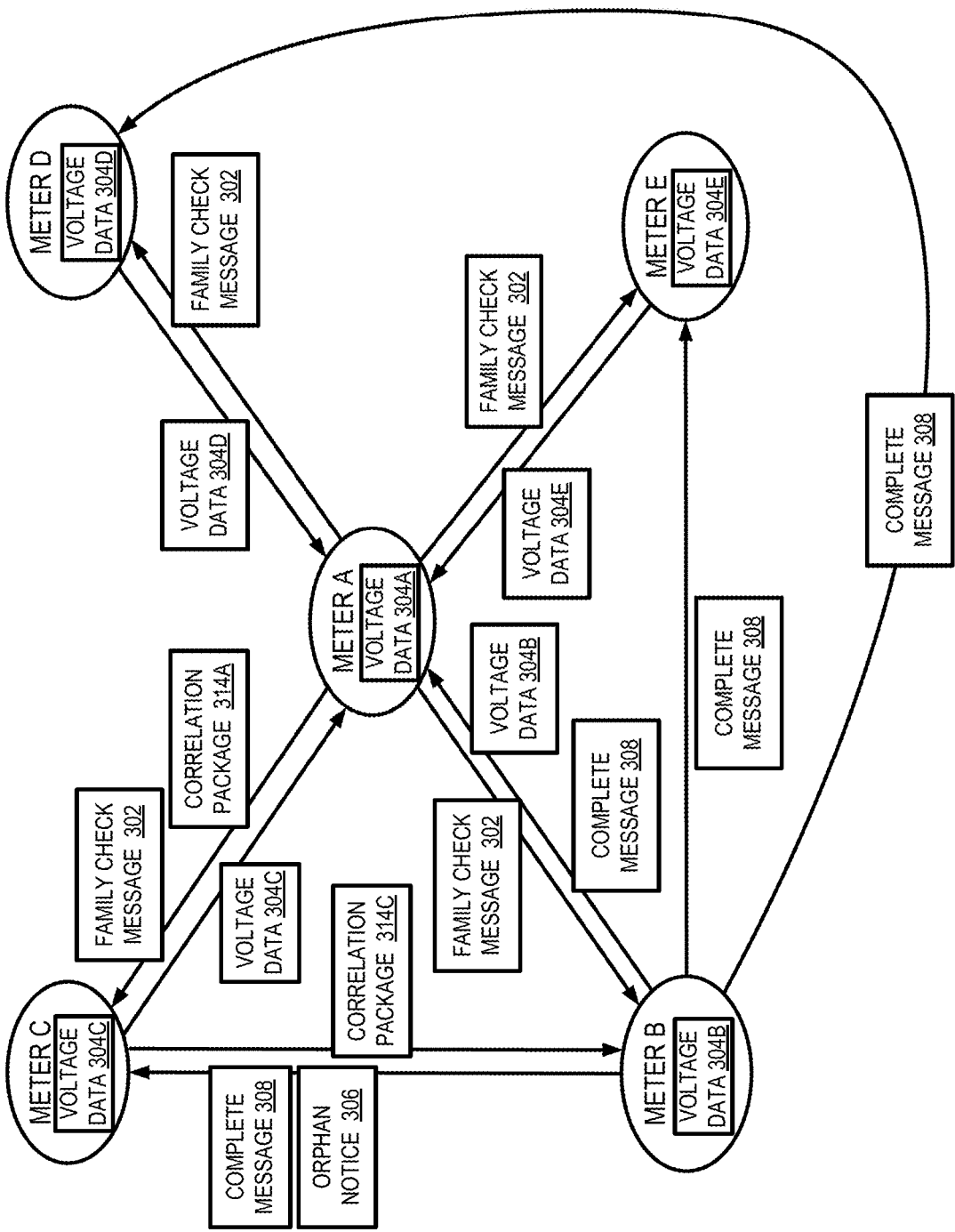
FIG. 3B shows another example of interactions among a family of meters during the family check, according to certain aspects of the present disclosure.

In the example shown in FIG. 3A, the initiating meter A performs all the correlations during the family check as well as the determination of the orphan meter. This requires the initiating meter A to have enough computation power to perform all of the needed computations. However, in some scenarios, each meter in the family has limited computation power. Requiring one meter to finish all the computations may not be feasible or may interfere with the normal operations of the meter. In such a scenario, the initiating meter can perform a portion of the computation and request a second meter in the family to perform the remaining computations. Similarly, the second meter can also perform a portion of the remaining computations and delegate the rest of the computations to other meters in the family. FIG. 3B shows an example of this scenario.

In FIG. 3B, the initiating meter A performs partial calculations of the correlation matrix 312, such as the correlations involving meter A. Meter A then sends a correlation package 314A to meter C. The correlation package 314A can include the incomplete correlation matrix 312 and the voltage data 304 (or the voltage change data). If meter A has finished the correlations involving meter A, meter A will not send its voltage data to meter C. Further, since meter C has stored its own voltage data, meter A will not send the voltage data of meter C. As a result, meter A can only send the voltage data 304 (or voltage change data) for meters B, D and E to meter C. Meter A can further instruct meter C to perform correlations to fill in the correlation matrix 312.

Depending on the available computational resources on meter C, meter C can perform all or a portion of the remaining correlations. For example, meter C can only calculate the correlations involving meter C and pass the remaining calculations to a next meter. The next meter can be determined according to the unfilled entries in the correlation matrix 312. For example, meter C may determine that the correlation matrix 312 still misses some of the correlations for meter B. Thus, meter C can choose meter B as the next meter and send meter B a correlation package 314C. The correlation package 314C can include, for example, the partially complete correlation matrix 312 and the voltage data 304 (or voltage change data) for meters D and E. The correlation package 314C can further include a command for meter B to complete the correlation matrix 312. Meter B can complete the remaining correlations or send a correlation package to a next meter according to the unfilled entries in the correlation matrix.

The last meter that completes the correlation matrix 312, meter B in the example shown in FIG. 3B, can further determine the relationship between the meters in the family. For example, as the last meter, meter B can calculate an averaged correlation for each meter in the family by averaging the correlations involving that meter as discussed above with respect to FIG. 3A. The averaged correlation is then compared with the threshold of correlation for family check, $TH_{FC}$. If the meter has an averaged correlation below $TH_{FC}$, the meter can be determined as not belong to the family and thus becomes an orphan meter. Meter B then generates and sends an orphan notice 306 to the orphan meter, meter C in the example shown in FIG. 3B. Meter C can enter the orphan mode as discussed above with respect to FIG. 3A. For meters whose averaged correlations are equal to or above $TH_{FC}$, they will remain in the family. Meter B will generate and send a complete message 308 to each of those meters, meters A, D, and E in FIG. 3B. Meter A, B, D, and E can exit the family check mode as discussed above and enter the normal mode. Note that it is likely that the meter determining the relationship between the meters in the family may determine, based on the correlation, that itself becomes an orphan meter. In such scenario, the meter can send the complete message to non-orphan meter and enters the orphan mode itself.

Figure 4:
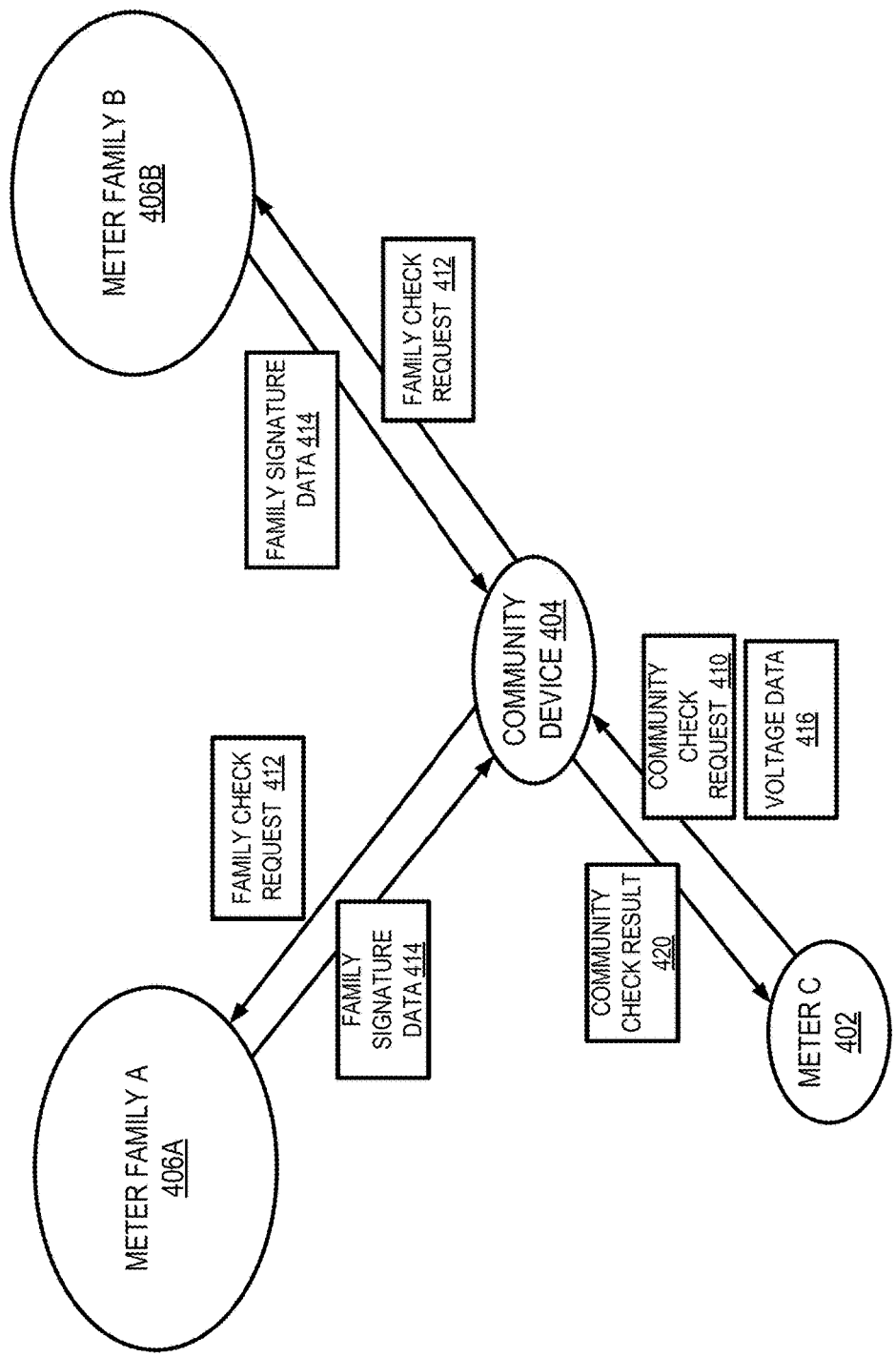
FIG. 4 shows an example of interactions among an orphan meter, a community device, and meter families during a community check, according to certain aspects of the disclosure.

FIG. 4 shows an example of interactions among an orphan meter, a community device, and meter families for a community check, according to certain aspects of the disclosure. Continuing the example shown in FIGS. 3A and 3B, in FIG. 4, meter C is an orphan meter 402. The orphan meter 402, after receiving the orphan notice 306 during the family check, can send a community check request 410 to a community device 404. The orphan meter 402 can select the community device 404 to be a device that the orphan meter 402 first-hopped through (i.e., directly communicated with) in the recent past, such as past 12 hours, past 24 hours, etc. The orphan meter 402 (or any meter in the network that may become an orphan meter) may maintain a list of such devices and select one of them as the community device during the community check. The selection of the community device can be performed randomly from the list or by selecting the most recent device first. It should be noted that the community device 404 may be a device connected to the electrical power distribution system, such as an electrical meter 160, or a non-meter device (e.g., a streetlight). The community device 404 may also be a device not connected to the electrical power distribution system, but connected to the mesh network 140, such as a router, a coordinator, a gateway, or any other devices capable of communicating with the meters 160.

The community check request 410 can request a community check to be performed for the orphan meter 402. Upon receiving the community check request 410, the community device 404 can communicate with meters that it has had direct communication with in the recent past, such as past 12 hours, 24 hours, etc. For example, the community device 404 can determine a set of meters that it had direct communication in the past hour and request a family check from that set of meters. If the set of meters include multiple meters of a same family, those meters can handle the conflicting family check triggers as described above with respect to FIG. 3A. Further, if a meter with which the community check device 404 had a direct communication is in an orphan mode, the community device 404 will refrain from sending the family check request 412 to such an orphan meter. For example, the community check device 404 can determine that a meter is in an orphan mode because a community check request has been received from that meter. After receiving the family check request 412, each meter can start the family check in their respective families as described above with respect to FIGS. 3A and 3B. After the family check, each family can further calculate a family signature data 414 and return it to the community device 404. The family signature data 414 can be, for example, the average voltage data of meters in the family. In some examples, orphan meters identified during the family check are excluded from the generation of the family signature data 414. It should be noted that those orphan meters may in turn request community check from their respective community devices as described herein.

The community device 404 can further identify a new family for the orphan meter 402 based on the family signature data 414 from different families. The community device 404 can, for example, calculate the correlation between the orphan meter 402 and each of the family signature data 414. The voltage data 416 of the orphan meter 402 can be sent along with the community check request 410. Alternatively, or additionally, the orphan meter 402 can continue to collect and save the voltage data 416 and send the voltage data to the community device 404 after its voltage data 416 has been collected. In some implementations, the community check request 410 can include a timestamp and a duration so that the family signatures and orphan meter voltage data used for the correlation are based on the voltage data in the same time period. The timestamp can indicates a past time or a future time relative to the time when the community check request 410 is sent.

As discussed above with respect to the family check procedure in FIGS. 3A and 3B, the correlation performed by the community device can be based on the voltage data of the orphan meter 402 and the family signature data 414. Alternatively, or additionally, the correlation can be performed using the voltage change data of the orphan meter 402 and the voltage change data derived from the family signature data 414. The community device 404 can calculate the correlations between the orphan meter and different families and select the highest correlation. If the highest correlation is equal to or above a threshold of correlation for community check $TH_{CC}$, the community device 404 can determine that the orphan meter belongs to the family corresponding to the highest correlation. If the highest correlation is below $TH_{CC}$, the community device 404 can determine that the orphan meter does not belong to any of the families. In some implementations, the threshold of correlation for community check $TH_{CC}$ is higher than the threshold of correlation for family check $TH_{FC}$ in order to reduce the false positive of identifying a new family for the orphan meter 402.

The community device 404 can return its determination regarding the new family for the orphan meter 402 in the community check result 420. Based on the community check result 420, the orphan meter 402 can send the validation report data 122 to the headend system 104 to report the recommended new family or that no new family is found for the orphan meter 402. In other examples, the orphan meter 402 may try to contact multiple community devices 404 for the new family before generating and sending the validation report data 122. For example, if the community device 404 is not in direct communication with other meters other than the orphan meter 402, the community device 404 can return the community check results indicating that the community device 404 is not connected to any new family. The orphan meter 402 can then contact another community device 404 for community check.

Figure 5:
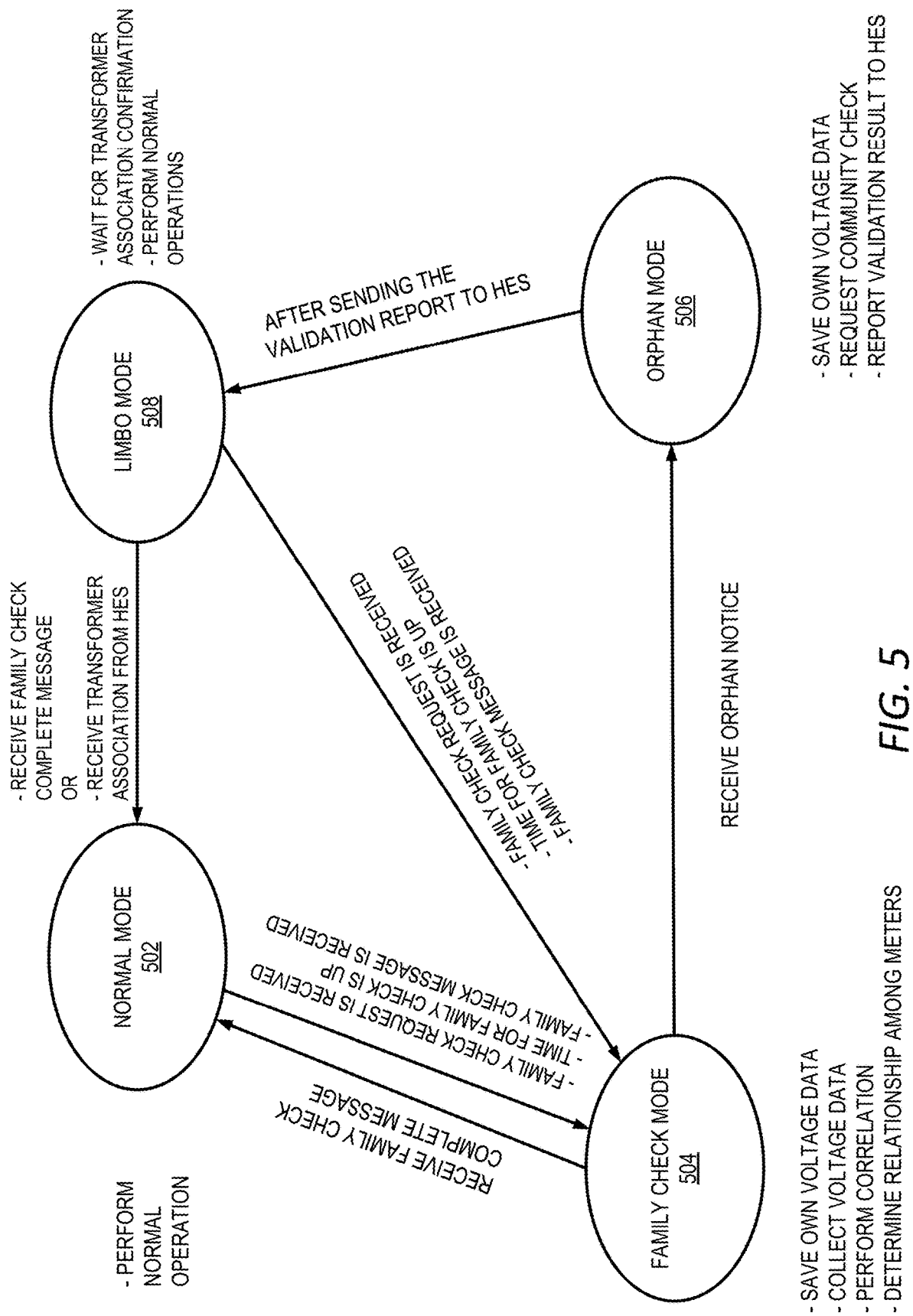
FIG. 5 is a diagram illustrating transitions of a meter between different states, according to certain aspects of the present disclosure.

FIG. 5 is a diagram summarizing the transitions of a meter 160 between different states, according to certain aspects of the present disclosure. As illustrated in FIG. 5 and discussed above with respect to FIGS. 3A, 3B, and 4, a meter 160 in a family can operate in four states: a normal operational mode 502, a family check mode 504, an orphan mode 506, and a limbo mode 508. In the normal operational mode 502, the meter 160 functions as normal as described above with respect to FIG. 2. The meter 160 may switch to the family check mode 504 from the normal operational mode 502 when the family of meters starts to perform a family check. The switch can be performed in response to, for example, a family check request is received by the meter 160 from a community device, a scheduled time for the family check is up, or a family check message is received from an initiating meter 160 in the family. When in the family check mode 504, the initiating meter 160 can save its own voltage data and collect voltage data from other meters. Each of the other meters can save and send its voltage meter to the initiating meter. The initiating meter can further perform the correlations. If needed, the initiating meter can perform a portion of the correlation and request other meters to perform the remaining correlations. The last meter that performs the correlation can also determine the relationship among the meters by comparing the correlations with a threshold of correlation for family check.

For meters whose correlation passes the threshold check, each of them will receive a family check complete message and return to the normal operational mode 502 and delete their respective stored voltage data. For orphan meters, each of them will receive an orphan notice and enters the orphan mode 506. While in the orphan mode 506, the orphan meter saves its own voltage data and requests a community device to perform a community check. After the orphan meter receives the validation results from the community device, the orphan meter can report the validation results to the headend system 104. Afterwards, the orphan meter enters a limbo mode 508. In the limbo mode 508, the orphan meter waits for the confirmation of its family association. In the meanwhile, the orphan meter also performs its operations as normal, such as collecting or generating meter measurement data and transmitting data to other meters in the mesh network 140, and so on. The orphan meter is also included in the family check of the current family as usual. As such, the orphan meter can enter the family check mode as other meters in the family.

The orphan meter can returns to normal mode 502 through two ways. The first way is when the orphan meter receives from the headend system 104 its new family assignment indicating the transformer that it is associated with. The new family assignment can be based on the new family found during the community check or determined by the headend system 104. After receiving the new family assignment, the orphan meter associates itself to the new transformer and returns to the normal operational mode 502. This process may include the orphan meter sending a message to the sibling meters in the current family that it is leaving and family so that the sibling meters can remove it from their respective lists of sibling meters. Alternatively, or additionally, the headend system 104 may send a message to each of the sibling meters in the current family indicating that the orphan meter is leaving the family and to instruct them to update their sibling meter list. The second way is when the orphan meter receive a family check complete message through a family check within its current family. This means that the orphan meter is found to be belonging to the current family. In this case, the orphan meter sends another validation report message to the headend system 104 to inform the headend system 104 that the previous validation report was a false alarm. The orphan meter can then return to the normal operational mode 502.

Figure 6:
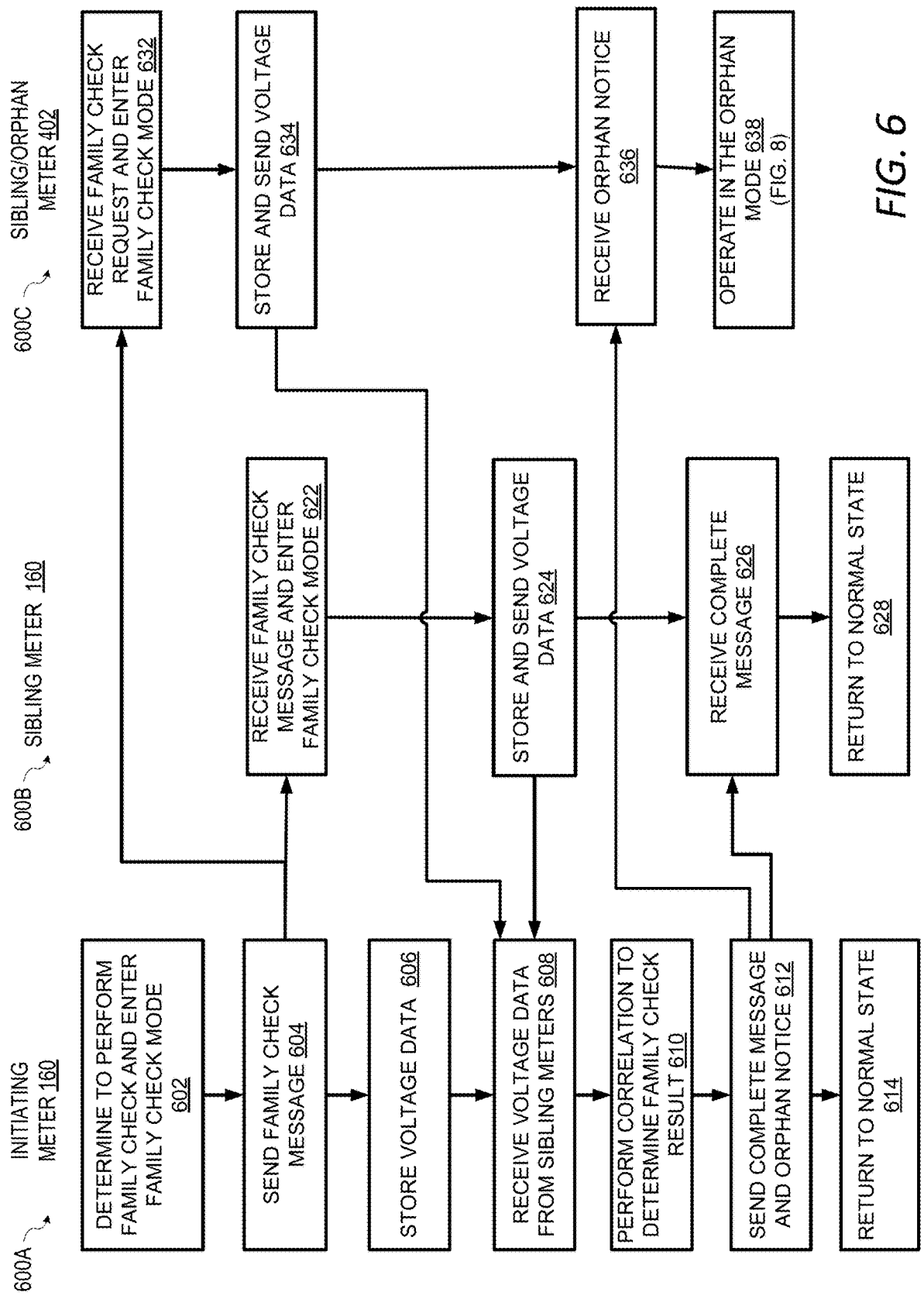
FIG. 6 shows an example of a process for a family check to validate the relationship between a family of meters connected to the same transformer, according to certain aspects of the disclosure.

Referring now to FIG. 6, FIG. 6 includes several flow diagrams that illustrate several processes 600A, 600B, and 600C for a family check process to validate the topology of the electrical power distribution system, according to certain aspects of the disclosure. The operations shown in the flow diagrams of FIG. 6 correspond to the example shown in FIG. 3A. In particular, the process 600A illustrates aspects of an initiating meter 160, the process 600B illustrates aspects of a non-initiating sibling meter 160, and the process 600C illustrates aspects of an orphan meter 402. Note that at the beginning of the family check, the orphan meter 402 is one of the sibling meters, but is determined to be an orphan meter through the family check. The initiating meter 160, the sibling meter 160, and the orphan meter 402 can implement operations in process 600A, 600B, and 600C, respectively by executing suitable program code. The processes 600A, 600B, and 600C will be described together below. For illustrative purposes, the processes 600A, 600B, and 600C are described with reference to certain examples depicted in the figures. Other implementations, however, are possible.

At block 602, the process 600A involves the initiating meter 160 in the family determining that a family check is to be performed and entering the family check mode. As discussed above with respect to FIGS. 3A-5, the initiating meter 160 can determine that a family check is to be performed if a family check request is received by the initiating meter 160 from a community device 404 or the scheduled time for the family check is up. In response to determining that the family check is to be performed, at block 604, the initiating meter 160 sends a family check message 302 to other sibling meters in the family. The family check message 302 instructs the sibling meters to enter the family check mode and send their respective voltage data to the initiating meter 160. The family check message 302 may further include a timestamp specifying the starting time point for the collected voltage data and a time duration for the voltage data. At block 606, the initiating meter 160 stores its own voltage data for the time period as indicated in the family check message 302 starting from the time point specified by the timestamp.

At block 622, the process 600B involves the sibling meter 160 receiving the family check message from the initiating meter and entering the family check mode. At block 624, the sibling meter stores and sends to the initiating meter the voltage data for the time period determined based on the timestamp specified in the family check message. Similarly, at block 632, the process 600C involves the orphan meter 402 receiving the family check message from the initiating meter and entering the family check mode. At block 634, the orphan meter stores and sends to the initiating meter its voltage data for the time period determined based on the timestamp and duration specified in the family check message.

At block 608, the process 600A involves the initiating meter receiving the voltage data from the sibling meters in the family including the orphan meter 402. At block 610, the initiating meter performs correlations to determine the relationship between the sibling meters in the family, such as by calculating the correlation matrix 312 shown in FIG. 3A. Based on the calculated correlations, the initiating meter can determine whether a sibling meter still belongs to the family or is an orphan meter, such as by comparing the averaged correlation of a meter with the threshold of correlation for family check $TH_{FC}$. At block 612, the initiating meter 160 sends a family check complete message to each of the meters that are determined to be with the family. If the initiating meter also determines an orphan meter, the initiating meter further sends an orphan notice to the orphan meter at block 612. At block 614, the initiating meter deletes the correlation matrix and the stored voltage data and returns to the normal operations mode.

At block 626, the process 600B involves the sibling meter receiving the family check complete message. At block 628, the sibling meter deletes the stored voltage data and returns to the normal operations mode. At block 636, the process 600C involves the orphan meter receiving the orphan notice. At block 638, the orphan meter enters and operates in the orphan mode to search for a new family. Additional details of the orphan meter operating in the orphan mode are provided below with respect to FIG. 8.

Figure 7:
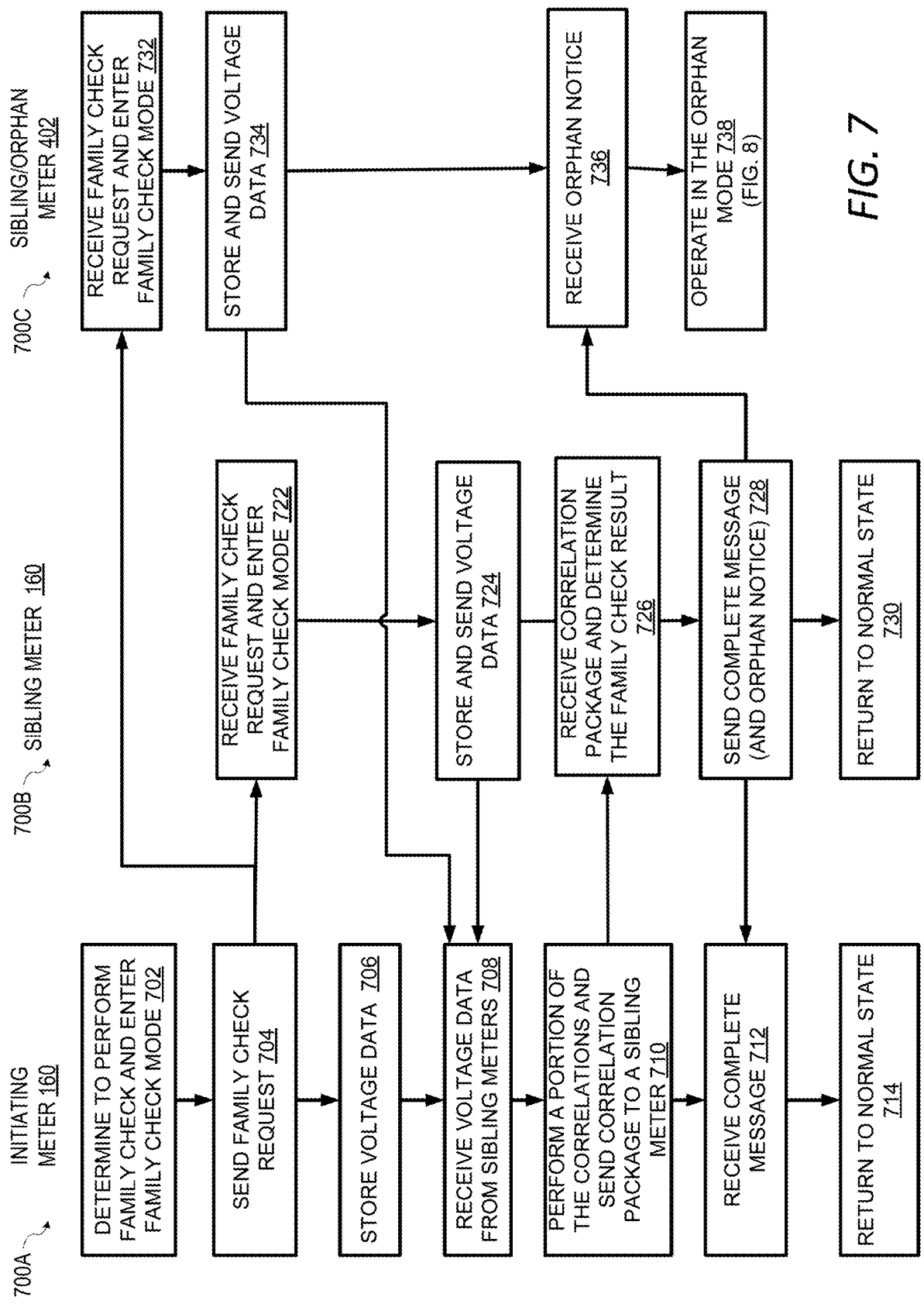
FIG. 7 shows another example of a process for a family check to validate the relationship among a family of meters connected to the same transformer, according to certain aspects of the disclosure.

FIG. 7 shows another example of a process for the family check to validate the relationship among a family of meters connected to the same transformer, according to certain aspects of the disclosure. Similar to FIG. 6, FIG. 7 includes several flow diagrams that illustrate several processes 700A, 700B, and 700C for a family check process. The operations shown in the flow diagrams of FIG. 7 correspond to the example shown in FIG. 3B. In particular, the process 700A illustrates aspects of a initiating meter 160, the process 700B illustrates aspects of a non-initiating sibling meter 160, and the process 700C illustrates aspects of an orphan meter 402. Similar to FIG. 6, at the beginning of the family check, the orphan meter 402 is one of the sibling meters, but is determined to be an orphan meter through the family check. The initiating meter 160, the sibling meter 160, and the orphan meter 402 can implement operations in process 700A, 700B, and 700C, respectively by executing suitable program code. The processes 700A, 700B, and 700C will be described together below. For illustrative purposes, the processes 700A, 700B, and 700C are described with reference to certain examples depicted in the figures. Other implementations, however, are possible.

Blocks 702-708 and 714 of the process 700A are similar to blocks 602-608 and 614 of the process 600A, respectively. Blocks 722, 724, and 730 of the process 700B are similar to blocks 622, 624, and 628 of the process 600B, respectively. Likewise, blocks 732-738 of the process 700C are similar to blocks 632-638 of the process 600C, respectively.

Different from the process 600A in FIG. 6, at block 710, the process 700A involves the initiating meter 160 performing a portion of the correlations, such as the correlations involving the initiating meter. The initiating meter 160 then sends a correlation package 314 to the sibling meter. The correlation package 314 can include the unfinished correlation matrix 312 and the voltage data or voltage change data for the sibling meters whose correlations are yet to be calculated. At block 726, the process 700B involves the sibling meter performing the remaining correlations to complete the correlation matrix and determine the relationship between the meters in the family as discussed above with respect to FIG. 3B. At block 728, the sibling meter sends an orphan notice to the orphan meter and a family check complete message to the non-orphan sibling meters. At block 712, the initiating meter receives the family check complete message and returns to the normal state at block 714.

Figure 8:
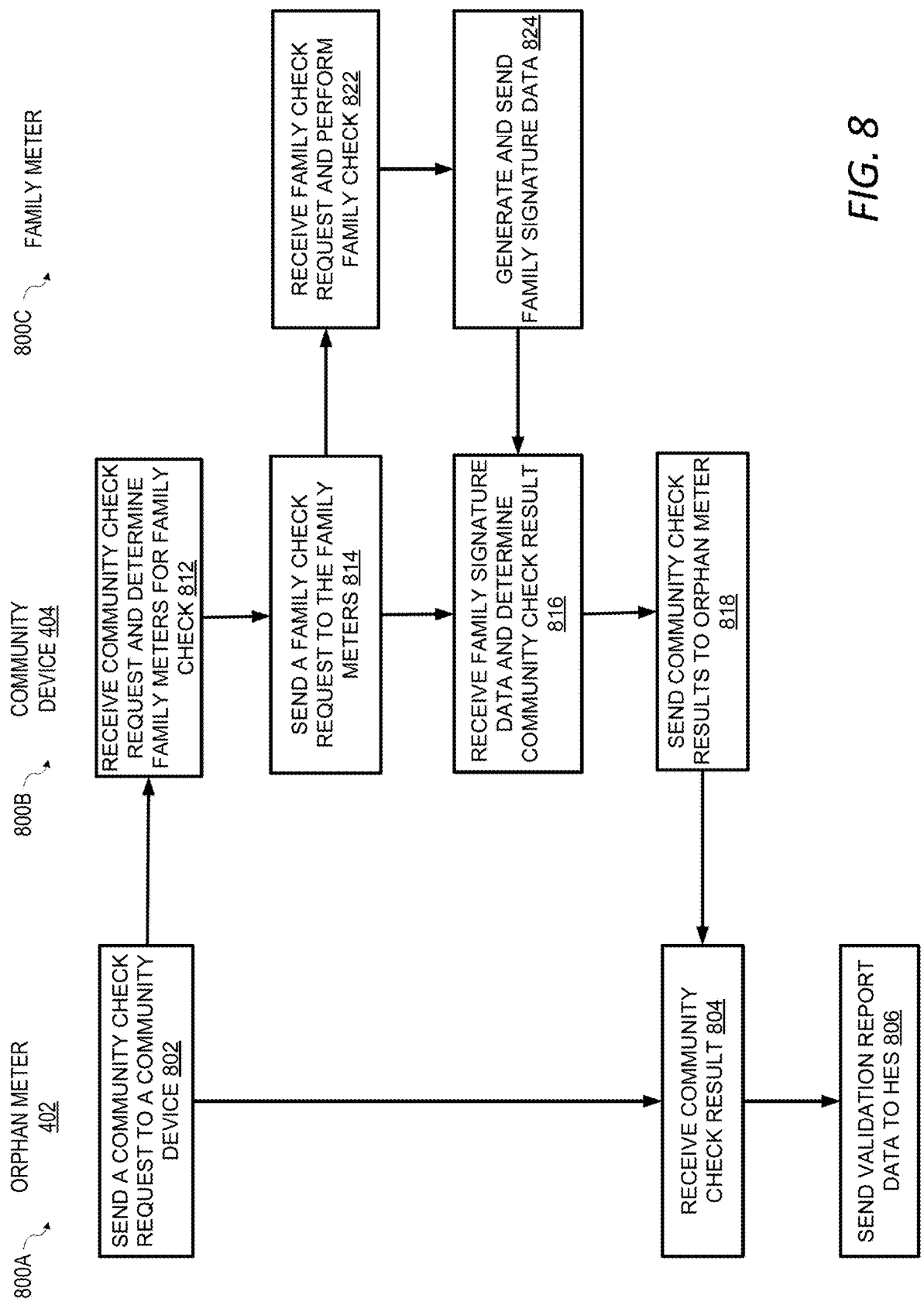
FIG. 8 shows an example of a process for community check to determine a new family for an orphan meter, according to certain aspects of the disclosure.

FIG. 8 shows an example of a process for a community check to determine a new family for an orphan meter, according to certain aspects of the disclosure. FIG. 8 includes several flow diagrams that illustrate several processes 800A, 800B, and 800C for a community check process. The operations shown in the flow diagrams of FIG. 8 correspond to the example shown in FIG. 4. In particular, the process 800A illustrates aspects of an orphan meter 402, the process 800B illustrates aspects of a community device 404, and the process 800C illustrates aspects of a family meter of a meter family 406 that the community device contacts during the community check. The orphan meter 402, the community device 404, and the family meter can implement operations in process 800A, 800B, and 800C, respectively by executing suitable program code. The processes 800A, 800B, and 800C will be described together below. For illustrative purposes, the processes 800A, 800B, and 800C are described with reference to certain examples depicted in the figures. Other implementations, however, are possible.

At block 802, the process 800A involves the orphan meter 402 sending a community check request 410 to the community device 404 to request the community device 404 to perform a community check to find a new family for the orphan meter 402. At block 812, the process 800B involves the community device 404 receiving the community check request 410 and determining meters that are in families different from the previous family of the orphan meter 402, referred to as family meters herein. It is noted that the community device 404 selects one family meter for one family. The family meters can include meters that have been in direct communication with the community device 404 in the recent past. At block 814, the process 800B involves sending a family check request to each of the selected family meters.

At block 822, the process 800C involves the family meter receiving the family check request and performing the family check as described above with respect to FIGS. 3A and 6 or FIGS. 3B and 7. At block 824, the family meter generates the family signature data based on the family check results and sends the family signature data to the community device 404. At block 816, the process 800B involves the community device 404 receiving the family signature data from each of the family meters. The community device 404 further determines a new family for the orphan meter 402 based on determining a correlation between the family signature data (or the change of the family signature data) and the voltage data (or the voltage change data) of the orphan meter 402. The community device 404 further compares the correlation with the threshold of correlation for community check. At block 818, the community device 404 sends the community check results to the orphan meter 402. The community check results can indicate the new family identified for the orphan meter 402 or that no new family is found.

At block 804, the process 800A involves the orphan meter 402 receiving the community check results from the community device 404. At block 806, the orphan meter 402 sends validation report data to the headend system 104 according to the community check results to either report the new family found during the community check or that the orphan meter 402 needs to be assigned to a new family by the headend system 104.

The validated topological information can be utilized in multiple applications. For example, the topological information can be utilized in corporative load management at the transformer level. In the corporative load management, the multiple premises connected to the same transformer can coordinate with each other to offset their power consumption to maintain the total power consumption at the transformer level to be below a given threshold to avoid losing power at the premises. In another example, the topology information can be utilized by the utility company to balance the load on different transformers.

Exemplary Meter

Figure 9:
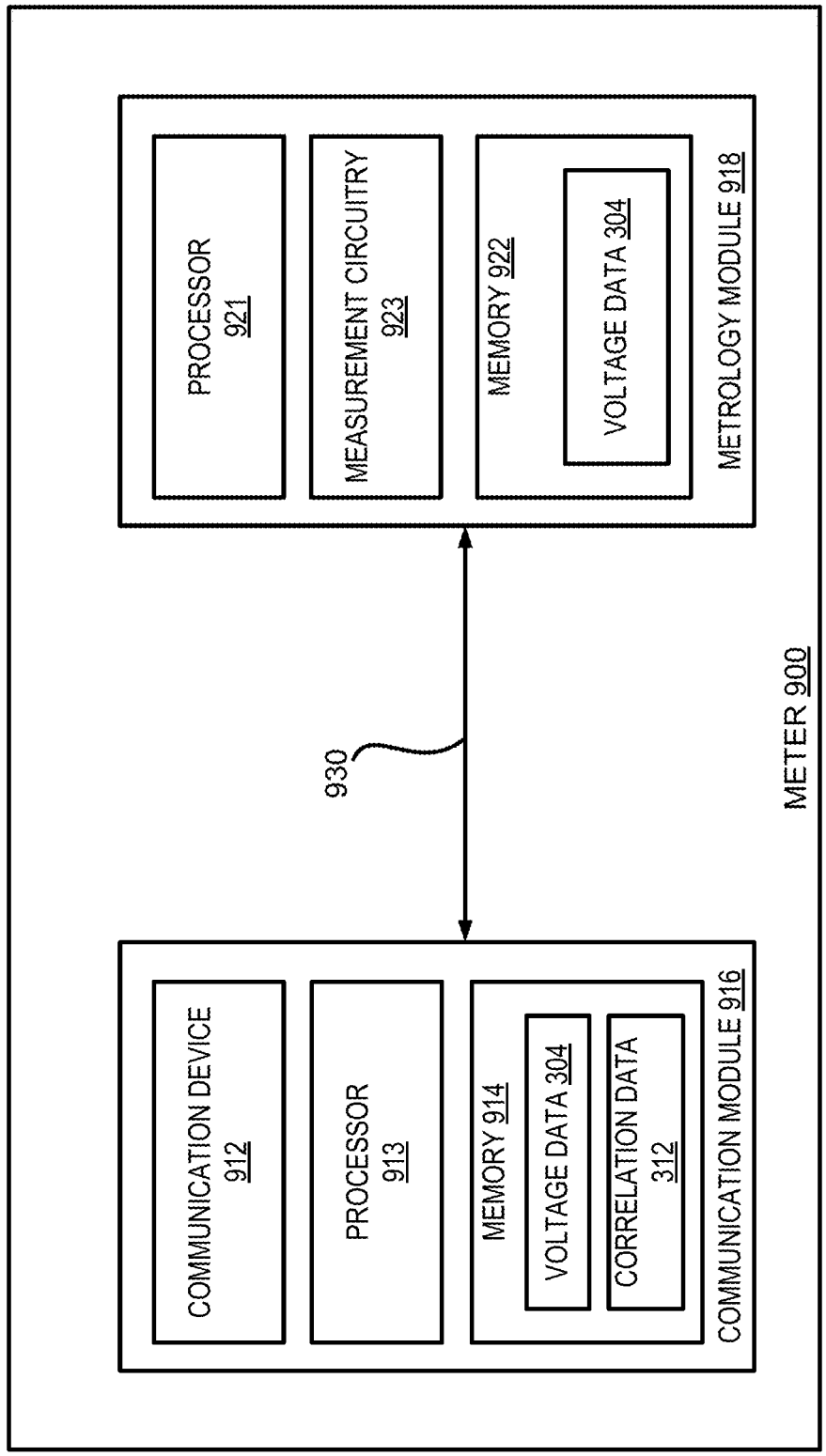
FIG. 9 is a block diagram depicting an example of a meter suitable for implementing aspects of the techniques and technologies presented herein.

FIG. 9 illustrates an exemplary meter 900 that can be employed to implement the autonomous topology validation described herein, such as a meter 160 or an orphan meter 402. The meter 900 includes a communication module 916 and a metrology module 918 connected through a local or serial connection 930. These two modules may be housed in the same unit on separate boards hence the local connection 930 may be an onboard socket. Alternatively, the modules may be housed separately and thus the local connection 930 may be a communication cable, such as a USB cable, or another conductor.

The function of the communication module 916 includes sending voltage data 304, correlation data 312, and other data to other nodes in the mesh network 140 and receiving data from the other meters or nodes in the mesh network 140. The function of the metrology module 918 includes the functions necessary to manage the resource, in particular, to allow access to the resource and to measure the resource used. The communication module 916 may include a communication device 912 such as an antenna and a radio. Alternatively, the communication device 912 may be any device that allows wireless or wired communication. The communication module 916 may also include a processor 913, and memory 914. The processor 913 controls functions performed by the communication module 916. The memory 914 may be utilized to store data used by the processor 913 to perform its function. The memory 914 may also store other data for the meter 900 such as the voltage data 304 and/or the correlation data 312.

The metrology module 918 may include a processor 921, memory 922, and measurement circuitry 923. The processor 921 in the metrology module 918 controls functions performed by the metrology module 918. The memory 922 stores data needed by the processor 921 to perform its functions and other data generated such as the voltage data 304. The communication module 916 and the metrology module 918 communicate with each other through the local connection 930 to provide data needed by the other module. The measurement circuitry 923 handles the measuring of the resource and may be used as the sensor to collect sensor data. Both the communication module 916 and the metrology module 918 may include computer-executable instructions stored in memory or in another type of computer-readable medium and one or more processors within the modules may execute the instructions to provide the functions described herein.

As discussed above, the community device can be a non-meter device, such as a router, a coordinator, a gateway, or another type of network device. In those scenarios, the non-meter device can include at least a processor for performing the functions of the respective device, including sending the family check request to family meters, calculating correlations between family signature data with the voltage data of the orphan meter, and determining the new family for the orphan meter. The non-meter device can further include a non-transitory computer-readable storage medium for storing data needed by the processor to perform its functions and other data generated by the processor, such as the correlation data, the family signature data, the voltage data of the orphan meter, and so on. The non-meter device may further include a communication device that allows wireless or wired communication of at least the community check request, the family check request, the voltage data, the family signature data, the community check results, and other data.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter.

Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A system for validating relationships between meters in an electrical power distribution system, comprising:
    a plurality of meters connected to the electrical power distribution system and communicatively connected through a communication network, wherein:
        the plurality of meters comprise a first group of meters and a second group of meters,
        the first group of meters were previously determined to be connected to a first transformer of the electrical power distribution system and are configured to perform a family check to determine an orphan meter in the first group of meters that is connected to a transformer different from the first transformer,
        performing the family check comprises sending, by a meter in the first group of meters, an orphan notice to the orphan meter and a complete message to other meters in the first group of meters, wherein the orphan notice causes the orphan meter to operate in an orphan mode, and the complete message causes the other meters to exit a family check mode and return to a normal operational mode, and
        the orphan meter, when operating in the orphan mode, is configured to send a community check request through the communication network to identify a new group for the orphan meter; and
    a community device communicatively connected to the orphan meter in the first group of meters and a meter in the second group of meters through the communication network and configured to:
        receive, from the orphan meter, the community check request through the communication network;
        send a family check request to the meter in the second group of meters, the family check request requesting the second group of meters to perform a family check and generate family signature data of the second group of meters;
        receive, from the meter in the second group of meters, the family signature data of the second group of meters through the communication network;
        generate community check results indicating whether the new group is found for the orphan meter based, at least in part, upon voltage data of the orphan meter and the family signature data of the second group of meters; and
        send the community check results to the orphan meter, wherein the orphan meter is further configured to send validation report data to a headend system over the communication network based on the community check results.

2. The system of claim 1, wherein performing the family check by a group of sibling meters comprises:
    sending, by a first sibling meter in the group, a family check message to other sibling meters in the group to cause the other sibling meters to operate in the family check mode, the family check message comprising a request for voltage data and a timestamp;
    storing, by each of the other sibling meters in the group operating in the family check mode, the voltage data for a time period determined according to the timestamp;
    sending, by each of the other sibling meters, the voltage data to the first sibling meter in the group;
    performing, by at least the first sibling meter, correlations between voltage change data determined using the voltage data of the sibling meters in the group; and
    determining, by one sibling meter in the group of sibling meters, relationships between the group of sibling meters based on the correlations.

3. The system of claim 2, wherein determining the relationships between the group of sibling meters based on the correlations comprises:
    calculating an average voltage data for each sibling meter in the group; and
    identifying an orphan meter among the group of sibling meters based on the average voltage data of the orphan meter falling below a threshold value of correlation.

4. The system of claim 2, wherein sending, by the first sibling meter in the group, a family check message is performed in response to the first sibling meter determining that a family check request is received or a time for performing the family check has arrived.

5. The system of claim 1, wherein the second group of meters generating the family signature data comprises averaging voltage data of meters in the second group of meters by excluding orphan meters identified through the family check of the second group of meters.

6. The system of claim 1, wherein generating the community check results comprise:
    calculating a correlation between voltage change data determined using the voltage data of the orphan meter and voltage change data of the family signature data of the second group of meters;
    comparing the correlation with a threshold value of correlation for community check; and
    determining that the orphan meter belongs to the second group of meters based on the correlation exceeding or equal to the threshold value of correlation for community check.

7. The system of claim 6, wherein generating community check results further comprises determining that the orphan meter does not belong to the second group of meters based on the correlation falling below the threshold value of correlation for community check, wherein the threshold value of correlation for community check is higher than a threshold value of correlation for determining the orphan meter during the family check.

8. The system of claim 1, wherein the second group of meters was previously determined to be connected to a second transformer of the electrical power distribution system, and wherein the second transformer is different from the first transformer.

9. A method performed by a community device for discovering relationships between an orphan meter and a group of meters connected to an electrical power distribution network, the method comprising:
  receiving, from the orphan meter, a community check request through a communication network communicatively connecting the orphan meter, the group of meters and the community device, wherein the orphan meter is identified through a family check performed by a second group of meters comprising the orphan meter;
  responsive to receiving the community check request, sending, through the communication network, a family check request to a meter that is in the group of meters and directly communicated with the community device during a past time period, the family check request requesting the group of meters to perform a family check and generate a family signature data of the group;
  receiving, from the meter in the group of meters, the family signature data of the group through the communication network;
  determining the relationships between the orphan meter and the group of meters based, at least in part, upon voltage data of the orphan meter and the family signature data of the group; and
  sending the determined relationships to the orphan meter, wherein the orphan meter is configured to send validation report data to a headend system over the communication network based on the determined relationships.

10. The method of claim 9, wherein the group of meters perform the family check by:
  sending, by a first meter in the group, a family check message to other meters in the group to cause the other meters to operate in a family check mode, the family check message comprising a request for voltage data and a timestamp;
  storing, by each of the other meters in the group operating in the family check mode, the voltage data for a time period determined according to the timestamp;
  sending, by each of the other meters, the voltage data to the first meter in the group;
  performing, by at least the first meter, correlations between voltage change data determined using the voltage data of the meters in the group; and
  determining, by one of the group of meters, relationships between the group of meters based on the correlations.

11. The method of claim 9, wherein the family check performed by the second group of meters comprising:
  sending, by a first meter in the second group of meters, a family check message to other meters in the second group to cause the other meters to operate in a family check mode, the family check message comprising a request for voltage data and a timestamp;
  storing, by each of the other meters in the second group of meters that are operating in the family check mode, the voltage data for a time period determined according to the timestamp;
  sending, by each of the other meters, the voltage data to the first meter in the second group of meters;
  performing, by at least the first meter, correlations between voltage change data determined using the voltage data of the meters in the second group of meters;
  calculating an average voltage data for each meter in the second group of meters; and
  identifying the orphan meter among the second group of meters based on the average voltage data of the orphan meter falling below a threshold value of correlation.

12. The method of claim 11, wherein the family check performed by the second group of meters further comprises:
  sending an orphan notice to the orphan meter and a complete message to other meters in the second group of meters, wherein the orphan notice causes the orphan meter to operate in an orphan mode, and the complete message causes the other meters to exit the family check mode and return to a normal operational mode.

13. The method of claim 11, wherein sending, by the first meter in the second group of meters, a family check message is performed in response to the first meter in the second group of meters determining that a family check request is received or a time for performing the family check has arrived.

14. The method of claim 9, wherein the group of meters generating the family signature data comprises averaging voltage data of meters in the group of meters by excluding orphan meters identified through the family check.

15. The method of claim 9, wherein determining the relationships between the orphan meter and the group of meters comprises:
  calculating a correlation between voltage change data determined using the voltage data of the orphan meter and voltage change data of the family signature data of the group of meters;
  comparing the correlation with a threshold value of correlation for community check; and
  determining that the orphan meter is part of the group of meters based on the correlation exceeding the threshold value of correlation for community check.

16. The method of claim 15, wherein determining the relationships between the orphan meter and the group of meters further comprises determining that the orphan meter is not part of the group based on the correlation falling below the threshold value of correlation for community check, wherein the threshold value of correlation for community check is higher than a threshold value of correlation for determining the orphan meter during the family check.

17. A non-transitory computer-readable storage medium having program code which, when executed by a processing device of a community device, cause the processing device to perform operations, the operations comprising:
  receiving, from an orphan meter, a community check request through a communication network communicatively connecting the orphan meter, a group of meters and the community device, wherein the orphan meter is identified through a family check performed by a second group of meters comprising the orphan meter;
  responsive to receiving the community check request, sending, through the communication network, a family check request to a meter that is in the group of meters and directly communicated with the community device during a past time period, the family check request requesting the group of meters to perform a family check and generate a family signature data of the group;

receiving, from the meter in the group of meters, the family signature data of the group through the communication network;

determining relationships between the orphan meter and the group of meters based, at least in part, upon voltage data of the orphan meter and the family signature data of the group; and sending the determined relationships to the orphan meter, wherein the orphan meter is configured to send validation report data to a headend system over the communication network based on the determined relationships.

18. The non-transitory computer-readable storage medium of claim 17, wherein the group of meters perform the family check by:

sending, by a first meter in the group, a family check message to other meters in the group to cause the other meters to operate in a family check mode, the family check message comprising a request for voltage data and a timestamp;

storing, by each of the other meters in the group operating in the family check mode, the voltage data for a time period determined according to the timestamp;

sending, by each of the other meters, the voltage data to the first meter in the group;

performing, by at least the first meter, correlations between voltage change data determined using the voltage data of the meters in the group; and determining, by one of the group of meters, relationships between the group of meters based on the correlations.

19. The non-transitory computer-readable storage medium of claim 17, wherein the family check performed by the second group of meters comprising:

sending, by a first meter in the second group of meters, a family check message to other meters in the second group to cause the other meters to operate in a family check mode, the family check message comprising a request for voltage data and a timestamp;

storing, by each of the other meters in the second group of meters that are operating in the family check mode, the voltage data for a time period determined according to the timestamp;

sending, by each of the other meters, the voltage data to the first meter in the second group of meters;

performing, by at least the first meter, correlations between voltage change data determined using the voltage data of the meters in the second group of meters;

calculating an average voltage data for each meter in the second group of meters; and identifying the orphan meter among the second group of meters based on the average voltage data of the orphan meter falling below a threshold value of correlation.

20. The non-transitory computer-readable storage medium of claim 17, wherein the group of meters generating the family signature data comprises averaging voltage data of meters in the group of meters by excluding orphan meters identified through the family check.

* * * * *